United States Patent [19]
Busta

[11] Patent Number: 4,592,238
[45] Date of Patent: Jun. 3, 1986

[54] LASER-RECRYSTALLIZED DIAPHRAGM PRESSURE SENSOR AND METHOD OF MAKING

[75] Inventor: Heinz H. Busta, Park Ridge, Ill.

[73] Assignee: Gould Inc., Rolling Meadows, Ill.

[21] Appl. No.: 723,015

[22] Filed: Apr. 15, 1985

[51] Int. Cl.⁴ ............................ G01L 7/08; G01L 9/06
[52] U.S. Cl. ................................. 73/727; 29/610 SG; 338/4; 92/103 SD
[58] Field of Search ................. 73/DIG. 4, 727, 721, 73/726, 720; 338/4, 42; 310/324; 29/610 SG; 92/103 SD, 103 R, 103 F

[56] References Cited
U.S. PATENT DOCUMENTS 3,858,150 12/1974 Gurtler .......................... 29/610 SG
4,003,127 1/1977 Jaffe et al. .................... 29/610 SG

OTHER PUBLICATIONS

Binder et al., "Laser-Recrystallized Polysilicon Resistors ...", Sensors and Actuators, 4(1983) 527-536.
Guckel et al., "Planar Processed Polysilicon Sealed Cavities ...", Proc. of IEDM, 12-1984, pp. 223-225.

Primary Examiner—Donald O. Woodiel
Attorney, Agent, or Firm—Jeannette M. Walder; G. Paul Edgell; Edward E. Sachs

[57] ABSTRACT

A pressure sensor includes a diaphragm and an overpressure stop, with a gap inbetween for displacement of the diaphragm in response to an applied pressure, the diaphragm being formed of laser-recrystallized polysilicon. Data extraction is accomplished either by depositing or forming four piezoresistors on the diaphragm and connecting them as the elements of a Wheatstone bridge circuit or by using the appropriately doped laser-recrystallized diaphragm as a piezoresistor itself.

26 Claims, 6 Drawing Figures

LASER-RECRYSTALLIZED DIAPHRAGM PRESSURE SENSOR AND METHOD OF MAKING

BACKGROUND OF THE INVENTION

This invention relates generally to pressure sensors and, more particularly to piezoresistive silicon diaphragm sensors.

Piezoresistive silicon diaphragm sensors are widely used for many industrial and medical pressure sensing applications. A pressure sensor is a three-dimensional displacement transducer that uses electronically monitored, geometric deformation of a diaphragm to measure applied pressures. Various means are used to convert the displacement of the transducer into an electrical output, the most common being the use of piezoelectric resistors deposited on the transducer and connected in a Wheatstone bridge circuit.

Typical prior art diaphragms are of the order of 1000 micrometers×1000 micrometers in area with a thickness of approximately 5-20 micrometers. These diaphragms are formed by using anisotropic silicon etching techniques and by using a p+-layer as the etch stop or by precisely controlling the etch time. On top of the single crystal silicon layer are four piezoresistive elements formed either by boron diffusion or ion implantation. A third method of forming piezoresistors on the silicon diaphragm sensor is described in J. Binder et al., "Laser-Recrystallized Polysilicon Resistors for Sensing in Integrated Circuit Applications", Sensors and Actuators, 4(1983) 527-536. Binder et al. uses laser-recystallized polycrystalline silicon as piezoresistors on a single crystal silicon diaphragm. Single crystal silicon diaphragm sensors have been popular due to their low cost of manufacturing and due to the excellent mechanical properties of single crystal silicon in terms of low hysteresis and good stability. Drawbacks of these sensors include the lack of an overpressure stop and yield losses in diaphragm etching. A typical prior art single-crystal silicon diaphragm sensor with piezoresistors deposited into the diaphragm is shown in FIG. 1.

An alternative to the single-crystal silicon diaphragm sensor which does include an overpressure stop is described in "Planar Processed Polysilicon Sealed Cavities for Pressure Transducer Arrays," H. Guckel and D. Burns, Proceedings of the IEDM Meeting, December 1984, San Francisco, CA, pp. 223-225. Guckel et al. form a displacement transducer by depositing an oxide post on a silicon substrate, depositing a polycrystalline silicon layer over the oxide post, then laterally etching the oxide to form the cavity between the polysilicon diaphragm and silicon substrate (which acts as the overpressure stop). Guckel et al. describe several methods for sealing the cavity for sealed pressure transducer applications. Guckel et al. do not indicate the optimum technique for data extraction, but suggests that piezoresistive, capacitive, and optical techniques are available.

The Guckel et al. pressure sensor is a significant advance over the silicon diaphragm sensor in that it offers an overpressure stop. The most significant drawback of the Guckel et al. pressure sensor is the lack of performance which is inherent in polysilicon.

Therefore, it is an object of the present invention to provide a pressure sensor with an overpressure stop and having the performance of single-crystal silicon.

It is another object of the present invention to provide a pressure sensor with an overpressure stop that is suitable for applications requiring sensors smaller than 100 micrometers×100 micrometers.

Additional objects, advantages, and novel feature of the invention will be set forth in part in the description which follows, and in part will become apparent to those skilled in the art upon examination of the following or may be learned by practice of the invention.

SUMMARY OF THE INVENTION

To achieve the foregoing and other objects and in accordance with the purposes of the present invention, a pressure sensor may comprise a diaphragm and an overpressure stop, the diaphragm and overpressure stop having a gap therebetween for displacement of the diaphragm in response to an applied pressure, the diaphragm being formed of laser-recrystallized polycrystalline silicon. Data extraction is accomplished either by depositing or forming four piezoresistors on the recrystallized diaphragm and connecting them as the elements of a Wheatstone bridge circuit or by using the laser-recrystallized diaphragm as a piezoresistor itself. Using the diaphragm as a piezoresistor permits manufacture of pressure sensors with diaphragms as small as 30 micrometers×30 micrometers. Such sensors, for instance, can be used to measure pressure in a plant cell. Laser-recrystallized polycrystalline silicon diaphragms have approximately three times the performance of the polysilicon diaphragms.

BRIEF DESCRIPTION OF THE DRAWINGS

The present invention is illustrated in the accompany drawings wherein.

DETAILED DESCRIPTION OF THE INVENTION

Figure 1:
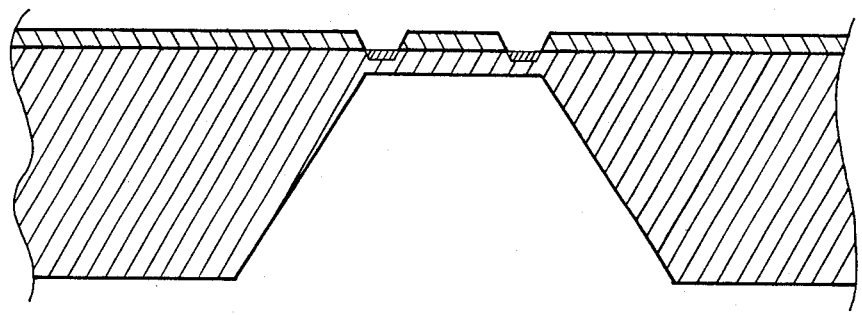
FIG. 1 is a cross-sectional schematic drawing of the prior art silicon diaphragm sensor with piezoresistors deposited into the diaphragm.
Figure 2:
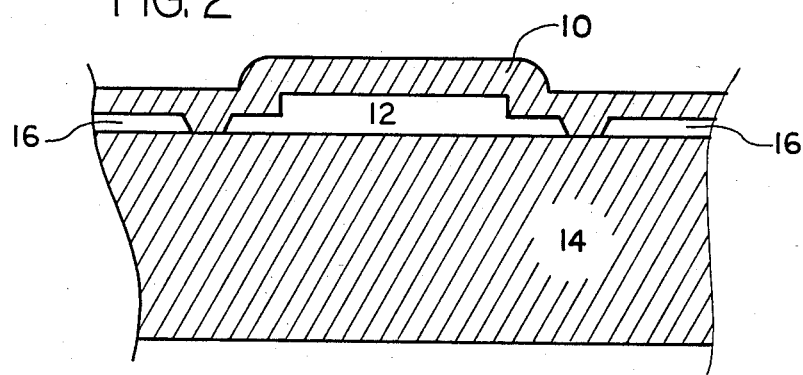
FIG. 2 is a cross-sectional schematic drawing of an embodiment of the present invention.

Referring to FIG. 2, substrate 14 forms the overpressure stop to diaphragm 10. Substrate 14 may be single crystal silicon or any high temperature material that is insensitive to the diaphragm etch, which in this case is hydrofluoric acid. The pressure sensor is formed by depositing a post oxide onto substrate 14. The area of the post oxide determines the area of the diaphragm and the thickness of the post oxide determines the overpressure stop setting. A second oxide is used to form the etch channel 16 around the post oxide. A thin layer (approximately 800 Angstroms) of silicon nitride ($Si_3N_4$) and poly-crystalline silicon are then deposited over the post oxide and the etch channel oxide. On top of this structure, a layer of capping oxide (approximately 4000 Angstroms) is deposited via chemical vapor deposition. The nitride layer and the capping layer are needed to ensure proper laser-recrystallization of the polysilicon film. The capping layer is removed after laser-recrystallization. Typical laser-recrystallization parameters using a CW argon laser are 7W laser power, scanning speed of 0.5 cm/sec., substrate temperature of 500 degrees C, spot size of 20 micrometers and step dimension of 10 micrometers. The thickness of the diaphragm is determined by the thickness of the polysilicon film. Once the film is laser-recrystallized, the oxide post is etched away forming cavity 12. Hydrofluoric acid etches are generally preferred, especially when the post is silicon dioxide.

Figure 3:
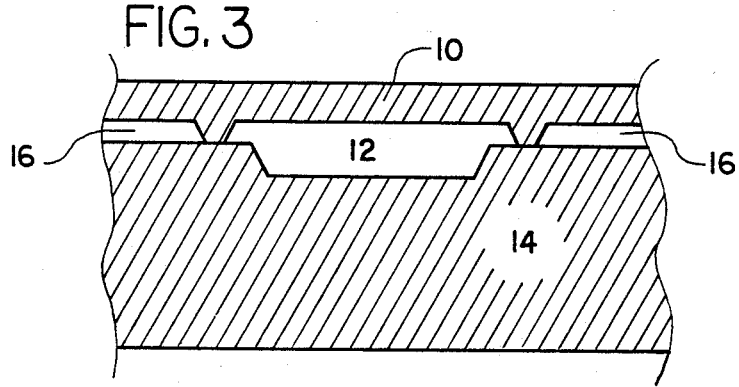
FIG. 3 is a cross-sectional schematic drawing of a planarized embodiment of the present invention.

FIG. 3 is a planarized version of the pressure sensor of FIG. 2, where like elements have like numbers. In FIG. 3, substrate 14 is first etched to form cavity 12. Here the depth of the cavity and the thickness of the post oxide determine the overpressure stop setting. Cavity 12 is filled with the post oxide, followed by formation of an etch channel 16 around cavity 12. A thin layer of $SiN_3$ is deposited next. Polycrystalline silicon is deposited over the oxide-filled cavity, the film is laser-recrystallized, then the oxide is etched away leaving diaphragm 10.

Figure 5:
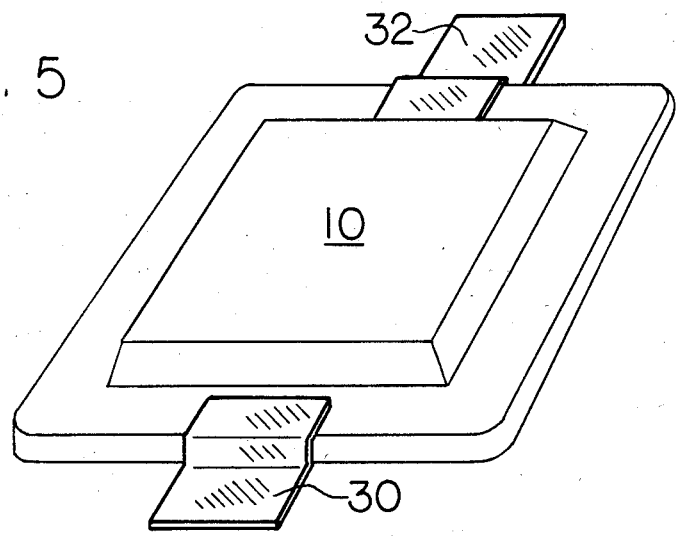
FIG. 5 is a perspective schematic drawing of the embodiment of FIG. 2 with resistive connections.
Figure 6:
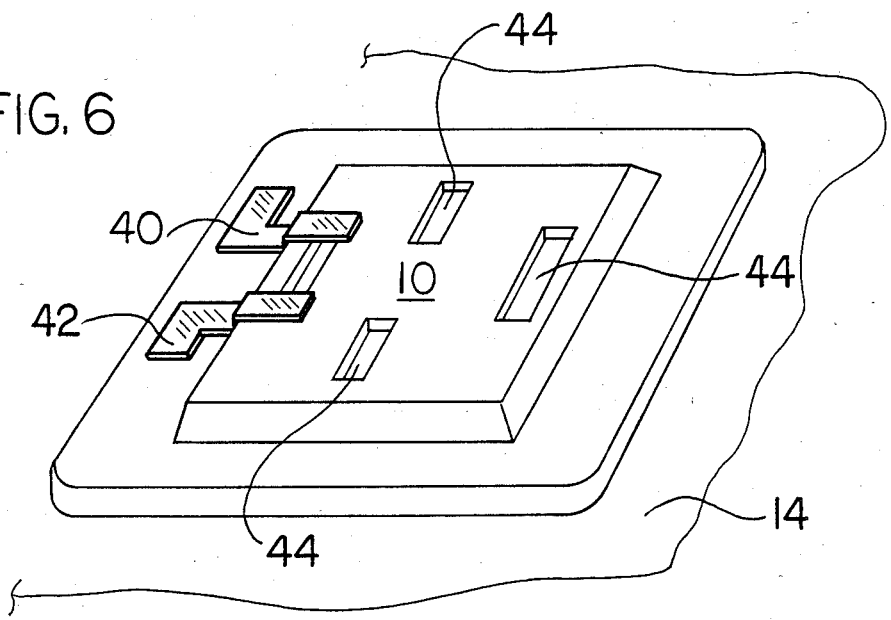
FIG. 6 is a perspective schematic drawing of the embodiment of FIG. 2 with piezoresistors ion implanted into the diaphragm.

Data can be extracted in two ways. In FIG. 5, diaphragm 10 is shown connected as a single piezoresistive element. This is accomplished by boron doping the polycrystalline silicon prior to laser-recrystallization and using n-type silicon for substrate 14, then connecting aluminum leads 30 and 32. In FIG. 6, p-type resistors 44 are ion implanted into laser-recrystallized diaphragm 10, which has been n-doped. Aluminum contacts 40, 42 are shown for one resistive connection. In this embodiment, the laser-recrystallized diaphragm 10 has been oxidized and sealed.

Diaphragm dimensions typically range from 100 micrometers×100 micrometers to 200 micrometers×200 micrometers to 1000 micrometers×1000 micrometers with thickness of the order of 2 micrometers. Clearly, more than one diaphragm can be formed on a given substrate. For example, an n×m array of diaphragms can be formed on a given substrate, where n is greater than 3 and m is greater than 1. The array of diaphragms can then be interconnected so that each diaphragm can be accessed individually for real-time or stored-signal extraction. Such an array can be used for robotic sensing and provides accuracy due to signal averaging and also "vision" by knowing the exact deflection and position of the pressure response.

Figure 4:
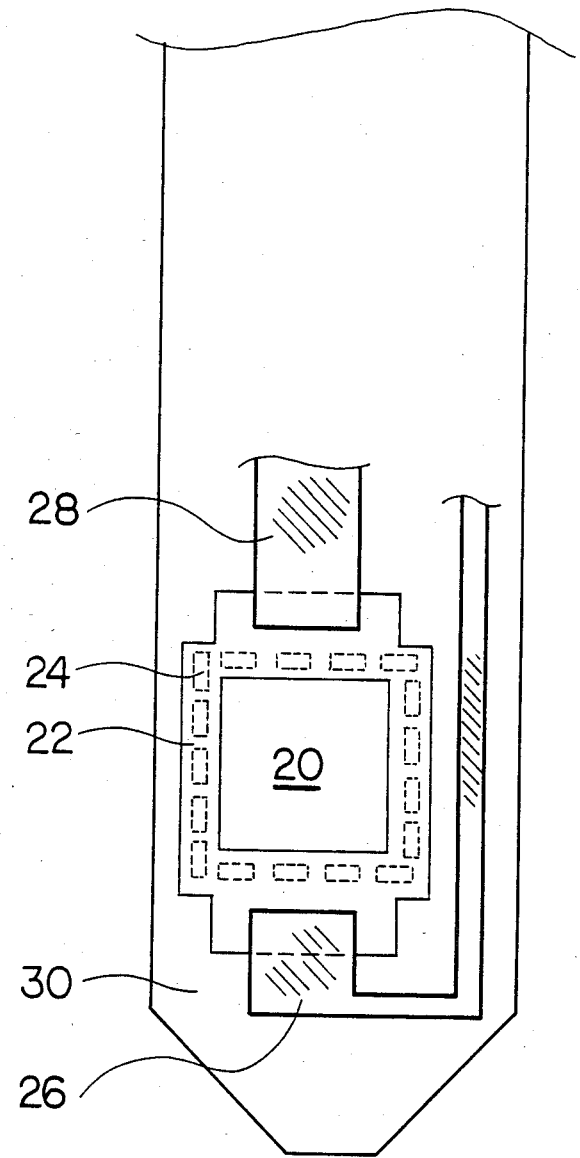
FIG. 4 is a top view of a complete pressure sensor according to the present invention.

The pressure sensor of the present invention is particularly useful for micro-sensor applications. Diaphragm dimensions of the order of 30 micrometers×30 micrometers to 50 micrometers×50 micrometers with thickness from 0.1 to 2 micrometers can be fabricated. Sensors of this size, however, are not large enough to support the addition of separate piezoresistors. A plan view of a micro-sensor, such as would be suitable for measuring the internal pressure of biological cells is shown in FIG. 4. Diaphragm 20 is deposited on substrate 30, which also serves as the structural part of the sensor. Etch channels 22 and diaphragm contact points to the substrate 24 are also shown. Aluminum leads 26 and 28 conduct the change in current generated by changes in deflection of diaphragm 20. In general, diaphragm 20 will be boron-doped either by ion implantation or diffusion to obtain reproducible piezoresistive response.

EXAMPLE

Four resistors having dimensions of W=5 micrometers and L=25 micrometers were deposited on a laser-recrystallized polysilicon diaphragm having dimensions of 200 micrometers×200 micrometers. The resistors were formed by boron ion implantation at 50 keV and a dose of $4 \times 10^{13}$ cm$^{-2}$. Prior to the resistor implant, the diaphragm was implanted with phosphorous at 80 keV and a dose of $2 \times 10^{12}$ cm$^{-2}$. Sealing of the diaphragm was performed at a pressure of 0.4 torr. The sensor was then die bonded into a 16 pin plastic IC package and eight gold were bonds were attached to the four resistors. Over the pressure range from 100 to 700 torr, a linear output of the Wheatstone bridge was obtained having a pressure sensitivity of 10.2 microvolts/volt torr.

Although the invention has been described and illustrated in detail, it is to be clearly understood that the same is by way of illustration and example only, and is not to be taken by way of limitation; the spirit and scope of this invention being limited only by the terms of the appended claims.

What is claimed is:

1. A pressure sensor comprising:
   a diaphragm and an overpressure stop opposed from one another,
   said diaphragm and overpressure stop having a gap therebetween for displacement of said diaphragm in response to an applied pressure,
   said diaphragm being formed of laserrecrystallized polycrystalline silicon.

2. The sensor of claim 1 wherein said overpressure stop is formed of a high temperature material that is substantially insensitive to HF etches.

3. The sensor of claim 2 wherein said material is single crystal silicon.

4. The sensor of claim 3 further comprising means for measuring the change in displacement of said diaphragm in response to the change in applied pressure.

5. The sensor of claim 4 wherein said measuring means is accomplished by connecting leads to said diaphragm for conducting through said diaphragm changes in current generated by changes in displacement of said diaphragm and wherein said diaphragm is formed of p-type silicon and said overpressure stop is formed of n-type silicon.

6. The sensor of claim 5 wherein said diaphragm has an area of about 200 micrometers×200 micrometers and a thickness of about 2 micrometers.

7. The sensor of claim 5 wherein said diaphragm has an area of about 100 micrometers×100 micrometers and a thickness of about 2 micrometers.

8. The sensor of claim 5 wherein said diaphragm has an area of from 30 micrometers×30 micrometers to about 50 micrometers×50 micrometers and a thickness of about 0.1 to 2 micrometers.

9. The sensor of claim 4 wherein said measuing means comprises four piezoresistive resistors ion implanted within said diaphragm and connected as the elements of a Wheatstone bridge circuit, said resistors being p-type and said diaphragm being n-type.

10. The sensor of claim 9 wherein said diaphragm has an area of at least 100 micrometers×100 micrometers.

11. The sensor of claim 10 wherein said diaphragm has an area of at least 100 micrometers×100 micrometers.

12. The sensor of claim 9 wherein said diaphragm has an area of at least 200 micrometers×200 micrometers.

13. The sensor of claim 2 further comprising means for measuring the change in displacement of said diaphragm in response to the change in applied pressure, said measuring means being coupled to said diaphragm.

14. The sensor of claim 13 wherein measuring means is accomplished by connecting leads to said diaphragm for conducting through said diaphragm changes in current generated by changes in displacement of said diaphragm.

15. The sensor of claim 14 wherein said diaphragm has an area of about 200 micrometers × 200 micrometers and a thickness of about 2 micrometers.

16. The sensor of claim 14 wherein said diaphragm has an area of about 100 micrometers × 100 micrometers and a thickness of about 2 micrometers.

17. The sensor of claim 14 wherein said diaphragm has an area of from 30 micrometers × 30 micrometers to about 50 micrometers × 50 micrometers and a thickness of about 0.1–2 micrometers.

18. The sensor of claim 13 wherein said measuring means comprises four piezoresistive resistors ion implanted within said diaphragm and connected as the elements of a Wheatstone bridge circuit, said resistors being p-type and said diaphragm being n-type.

19. The sensor of claim 18 wherein said diaphragm has an area of at least 100 micrometers × 100 micrometers.

20. A method of making a pressure transducer comprising the steps of:
 (a) forming an oxide post on the surface of a substrate, the area of said post corresponding to the area of a diaphragm to be formed;
 (b) forming an etch channel on the surface of said substrate, said etch channel surrounding said oxide post;
 (c) depositing a layer of polycrystalline silicon on said substrate covering said oxide post;
 (d) laser-recrystallizing said polycrystalline layer, thereby forming said diaphragm;
 (e) laterally etching said oxide with an oxide etching solution , thereby forming a gap between said diaphragm and said substrate.

21. The method of claim 20 wherein said substrate is formed of single crystal silicon.

22. The method of claim 20 wherein said substrate is formed of a high temperature material that is substantially insensitive to said oxide etching solution.

23. The method of claim 20 wherein step (a) is replaced by
 (a1) etching said substrate to form a cavity within said substrate, the area of said cavity corresponding to the area of the diaphragm to be formed,
 (a2) depositing an oxide within said cavity.

24. The method of claim 20 further comprising steps:
 (f) forming four piezoresistive resistors on said laser-recrystallized layer; and
 (g) connecting said resistors as the four elements of a Wheatstone bridge circuit.

25. The method of claim 20 further comprising step:
 (h) connecting leads to said diaphragm.

26. A multi-element sensor comprising:
an n × m array of diaphragms having a common overpressure stop;
each diaphragm having a gap between itself and said overpressure stop for displacement of said diaphragm in response to an applied pressure;
each diaphragm being formed of laser-recrystallized polycrystalline silicon;
wherein n is at least 3 and m is at least 1.

* * * * *